United States Patent [19]

Franz et al.

[11] 4,178,408

[45] Dec. 11, 1979

[54] FLAME-PROOF EPOXY FIBROUS STRUCTURE AND LAMINATES THEREOF

[75] Inventors: Arnold Franz, Troisdorf-Spich; Werner Stein, Troisdorf-Kriegsdorf, both of Fed. Rep. of Germany

[73] Assignee: Dynamit Nobel Aktiengesellschaft, Troisdorf, Fed. Rep. of Germany

[21] Appl. No.: 874,966

[22] Filed: Feb. 3, 1978

Related U.S. Application Data

[63] Continuation of Ser. No. 740,501, Nov. 10, 1976, abandoned, which is a continuation of Ser. No. 442,938, Feb. 15, 1974, abandoned.

[30] Foreign Application Priority Data

Feb. 21, 1973 [DE] Fed. Rep. of Germany ....... 2308433

[51] Int. Cl.$^2$ .................... D04H 1/58; B32B 17/04
[52] U.S. Cl. .................... 428/285; 428/286; 428/288; 428/290; 428/248; 428/413; 428/417; 428/921; 428/251; 428/268; 106/15 FP; 260/33.2 EP; 260/45.7 R

[58] Field of Search ............. 428/361, 378, 413, 417, 428/265, 285, 921, 248, 286, 288, 290, 289; 260/2.5 FP, 2.5 B, 33.2 EP; 106/15 FP

[56] References Cited

U.S. PATENT DOCUMENTS

| T918,001 | 1/1974 | Gray et al. | 260/40 R |
|---|---|---|---|
| 3,252,850 | 5/1966 | Partansky | 161/185 |
| 3,326,832 | 6/1967 | Rauschenbach et al. | 260/28.5 |
| 3,420,786 | 1/1969 | Weber et al. | 260/2.5 |
| 3,660,321 | 5/1972 | Praetzel et al. | 260/2.5 FP |
| 3,666,617 | 5/1972 | Marciniak | 161/186 |

*Primary Examiner*—George F. Lesmes
*Assistant Examiner*—Alexander S. Thomas
*Attorney, Agent, or Firm*—Sprung, Felfe, Horn, Lynch & Kramer

[57] ABSTRACT

A formed epoxy resin composition comprising a condensed epoxy resin and pentabromodiphenylether; the use of pentabromodiphenylether alone or with other brominated diphenyl ethers as a flame-retardant agent for compositions containing epoxide resins especially fibrous substrates of glass and/or cellulose fibers containing epoxide resins therein.

23 Claims, No Drawings

FLAME-PROOF EPOXY FIBROUS STRUCTURE AND LAMINATES THEREOF

This is a continuation of application Ser. No. 740,501, filed Nov. 10, 1976, now abandoned, which is a continuation of application Ser. No. 442,938 filed Feb. 15, 1974, now abandoned.

BACKGROUND OF THE INVENTION

1. Field of the Invention

This invention relates to the use of pentabromodiphenylether as a flame-retarding agent in epoxide resin compositions. More particularly, this invention relates to the use of pentabromodiphenylether alone or in admixture with other brominated diphenyl ethers as an agent which not only improves the flame-retardant properties of epoxide resin compositions, but imparts desirable structural properties to fibrous compositions impregnated with epoxide resin compositions. This invention is directed to laminated articles containing a layer of a fibrous base of glass fibers or cellulose impregnated with an epoxide resin composition containing pentabromodiphenylether alone or in admixture with other brominated diphenyl ethers.

DISCUSSION OF THE PRIOR ART

Pressed laminates may contain reinforcing substances, especially glass silk fibers, in the form of woven fabrics, fleeces or mats. Such laminates are manufactured by impregnating webs of glass silk fabric, for example, with epoxy resins and hardening the latter in a heating press. The reinforcement may also consist of cellulose, for example, in the form of paper, webs, monofils or fiber layers, or synthetic papers, webs or fiber layer forming substances such as polyesters or polyamides. Pressed laminates are usually built up of one layer or of a plurality of superimposed layers. They may be covered on one or both sides, in the same working operation and using a heat-activated adhesive, with a metal foil, preferably a copper foil, for electrical insulating materials by known methods, such as supports for printed circuits, for example. Printed circuits are used in many electrical and electronic apparatus, such as radio and television receivers, computers etc.

For use in electrical applications, it is especially important that the hard paper simultaneously possess good electrical insulating ability, high mechanical strength and good workability in the making of printed circuits. Good workability in epoxy laminates means that the material can be cut, drilled and punched at room temperature or with slight heating, and the support has good chemical resistance to solvents such as trichloroethylene, methylethylketone and lyes such as soda lye, which are used in the manufacture of printed circuits.

Pressed laminates, however, may also be used as a building material, such as a decorative paneling in interior finishing.

The following requirements must be met by high-quality materials:

a. Insulation resistance after 4 days at 40° C., 92% rel. hum. $\geq 10^{10}$ ohms b. Electrolytic corrosion action on metals after 4 days at 40° C., 92% rel. hum. DIN 53,489 AN 1.4 c. Bending strength at 23° C. 2800 kp/cm$^2$ d. Temperature stability:

Long term: 25,000 hours 130° C.

Short term: 10 min. 260° C.

e. Cuttability at 23° C. No cracking f. Layer-to-layer bond after ball pressure test as a criterion of punching ability. Rating $\leq 2$ g. Resistance to trichlorethylene vapor At least 5 minutes h. Resistance to 3 wt.% caustic soda solution at 40° C. At least 3 minutes Furthermore, the material for certain applications must be flame-proof to the greatest possible extent.

Epoxy laminates are known whose flame resistance has been improved over that of ordinary epoxy laminates by the addition of flame-retardant substances.

Flame resistance sufficient for practical requirements is achieved when the laminate qualifies for flame class SE 1 or SE 0 when exposed vertically to a flame.

Thus, fire class SE 0 or SE 1 (in accordance with UL 492) is achieved in epoxy resin laminates by adding tetrabromobisphenol A to the epoxy resin system. As a rule, the bisphenol A is replaced in the manufacture of the resin with tetrabromobisphenol A to such an extent that the finished epoxy resins will have a bromine content of 18 to 20%, but then resistance to high temperatures diminishes to a considerable extent. However, temperature stability is especially important in the case of epoxy laminates, especially when they are to be used in electrical apparatus where they are subjected to extreme heat stress due to the self-heating of the components mounted on the laminate or due to ambient heat. But in epoxy resin laminates containing tetrabromobisphenol A as flame retardant, temperature stability is considerably poorer in the long-term test at 130° C. Particularly striking is the poor temperature stability of epoxy resins containing tetrabromobisphenol A in the short-term test of 10 minutes at 260° C. in silicone oil. The stress destroys the epoxy resin system and leaves a brownish-black laminate.

This thermal stress at 260° C. in silicone oil is based on the requirements to be met in soldering and in the removal of solder, but it may also be used as a test for extreme temperatures encountered in practice. The brownish-black discoloration indicates that the laminate has been rendered useless by drastic deterioration in regard to bending strength and insulation resistance, for example, and is due to the decomposition of the brominated bisphenols.

It has, therefore, become desirable to provide a flame-retarding agent for epoxy resin compositions which does not undergo decomposition in the manner of brominated bisphenols. It has, furthermore, become desirable to provide a flame-retarding agent which improves the physical properties of fibrous substrates containing the same. It has also become desirable to provide such a flame-retardant agent which permits the impregnated article to pass the SE 0 or SE 1 test established by the Underwriters' Laboratory.

SUMMARY OF THE INVENTION

Broadly, this invention contemplates a formed epoxide resin composition comprising a condensed epoxy resin and pentabromodiphenylether. The present invention is particularly concerned with a formed epoxide resin composition containing between 5 and 30 wt.% of pentabromodiphenylether, hereinafter, PBD.

In accordance with the present invention it has been found that fibrous substrates which are impregnated with a condensed epoxy resin composition containing pentabromodiphenylether possess excellent flame-retardant characteristics. Additionally, they have exceptionally good physical properties. For instance, a fibrous substrate treated with an epoxy resin containing pentabromodiphenylether can be subjected to a bending test to determine its bending strength. After 3 days of testing at 200° C., the bending strength is at least 1,000 kp./sq. cm. Other physical properties of the fibrous composition will appear from the disclosure below.

DESCRIPTION OF PREFERRED EMBODIMENTS

The subject matter of the invention is, therefore, a method for the manufacture of reinforced pressed laminates by impregnation of the reinforcing layers with epoxy resin solutions containing flame-retardants, followed by drying the impregnated material with preliminary condensation of the resin and then by the full hardening of superimposed layers with the use of heat and pressure, which is characterized in that pentabromodiphenylether (PLD) or mixtures thereof with additional bromination products of diphenyl ether are incorporated as flame retardants in amounts of 5 to 30 wt.%, with reference to the solvent-free substance of the impregnating solution.

Additional use of pressed laminates prepared by the method of the invention as a support material for printed circuits, as electrical insulation materials, or as wall covering panels is contemplated.

By the addition of pentabromodiphenylether or of a mixture of pentabromodiphenylether with additional bromination products of diphenyl ether, such as technical pentabromodiphenyl ether for example, pressed laminates are achieved having a high flame resistance and self-extraction combined with high or additionally improved thermal, electrical, mechanical and working properties.

Surprisingly it has been found that the addition of PBD also improves the bond between layers and thus improves the important characteristic of punchability. In addition, strength of adhesion is also improved, which is diminished by prior art brominated flame retardants in epoxy laminates.

Particularly noteworthy is the temperature stability, which is much better than that of flame-proof epoxy laminates of the prior art and is at least equal to that of epoxy laminates containing no flame retardants. This becomes evident in the long-term exposure to 130° C. for 25,000 hours.

The products of the process are surprisingly stable in the above-mentioned high-temperature test at 260° C. in silicone oil for 10 minutes.

Particularly advantageous in view of the increasingly stringent requirements is the long-term stability at 200° C., amounting to several weeks, which reflects a stability which has hitherto been impossible in flame-proof epoxy laminates.

The test for flame retardancy pursuant to UL Subject 492, Paragraph 280 A-K (UL 492), devised by Underwriters' Laboratories, U.S.A., contains the following details.

A specimen measuring 12.7×102 mm. long is suspended with a long axis vertical such that the front end hangs 9.5 mm above the tip of the 9.5 mm. diameter Bunsen burner. The burner is adjusted to a blue flame of 19 mm. and is held for a period of 10 seconds centrally under the bottom end of the specimen. After removal of the flame the afterburning or afterglow is measured. After complete extinction the specimen is ignited a second time for a period of 10 seconds. The second afterburning or afterglow is also measured. Flameproof materials are rated by this UL vertical flame application test in two combustibility classes:

1. SE 1 (Self-extinguishing 1)

Here the average afterburning time must be equal to or less than 25 sec. The maximum must not exceed 30 seconds.

2. SE 0 (Self-extinguishing 0)

Here the average afterburning time must be equal to or less than 5 seconds, and the maximum must not be greater than 10 seconds.

Material classified SE 1 and especially SE 0 by these stringent tests offers good passive fire protection for electrical apparatus in which the insulation may become ignited in case of trouble. However SE 1 1 and SE 0 ratings have hitherto been achievable only by a very few laminates and these were of deficient quality owing to their composition and the additives used.

The material used in the reinforcing layers is especially glass material, such as glass fabric, glass fiber fleece, glass mats or layers of glass fibers, but papers may also be used, such as cotton papers, cotton linters papers, layers of sulfate cellulose or sulfite cellulose, rats or fabrics of synthetic fibers such as polyesters, polyamides or other polymeric organic substances. Also possible is the use of fibrous natural substances such as asbestos or mineral wool, and also the use or involvement of straw, sawdust and fillers, especially in the case of wall panels and decorative laminates for buildings or vehicles.

By "epoxy resins" are meant known hardenable, fluid, semifluid or solid resins made from aromatic and aliphatic diols, such as diphenylolpropane (bisphenol A), diphenylolmethane (bisphenol F9, diphenolic acid, or phenols derived from cashew nut oil to which aliphatic diols and triols are added if desired, and epoxides such as epichlorohydrin or dichlorohydrin, with the addition, if desired, of reactive diluents, with molar ratios of the diols to the epoxides of about 1:1 to 1:2, which can be hardened by means of amines, especially tertiary amines, such as piperidine, benzyldimethylamine, m-phenylenediamine, diethyl- or dimethyl-aminopropylamine, tris(dimethylaminomethyl)-phenol, diethylenetriamine, dicyandiamide etc., or anhydrides of polybasic acids such as phthalic acid anhydride, pyromellitic acid anhydride, dodecenylsuccinic acid anhydride, etc.

It is possible to distribute liquid PBD into the impregnating solution by stirring, but preferably it is added after having been dissolved in a solvent. The concentration of the solution may be selected within side limits, solvents being especially preferred which have boiling points between 30° and 120° C. and which evaporate upon the drying of the laminate. 30 wt.% to 80 wt.% solutions are desirable. The solvents may be any which wholly or partially dissolve PBD, especially ether, alcohols, hydrocarbons and ketones, such as diethylether, methanol, ethanol, the propanols, pentane, hexane, benzines, benzene, acetone, or, if desired, mixtures of same with one another or with water.

Technical pentabromodiphenylether has, up to about 50° C., a relatively high viscosity, or it contains small, crystaline amounts of, for example, hexabromodiphenylether, and is preferably added after preheating or dissolving. No precipitation of crystals is encountered in mixtures of brominated diphenyl ethers in which the bromination products tribromodiphenylether to octabromodiphenylether are present. In the case of mixtures such as these their use as flame retardants is simplified.

The content of the various bromination products of diphenyl ether in the mixture may vary within wide limits.

Preferred mixtures contain:
Pentabromophenylether 40–60 wt.%
Tetrabromodiphenylether 15–45 wt.%
Hexabromodiphenylether 1–20 wt.%
Tribromodiphenylether 0–5 wt.%
Octabromodiphenylether 0–2 wt.%

The composition may differ from the above if the viscosity is not too high, but generally the viscosity at 50° C. is not to exceed 9000 and is to be generally between 300 and 7000, but preferably not above 4000 cP.

The bromine content of such mixtures will generally amount to from 66.0 to 70.5, especially 67.0 to 69.5 wt.%.

A solubility test was performed to determine the stability of solutions in acetone in different ratios of admixture as listed in Table A. From the values given in this table it can be seen that the desired good solubility in solvents and the avoidance of crystallization are obtained.

Pentabromodiphenylether should be used in amounts of 35 to 70% by weight in the mixture of the bromination products of diphenyl ether which are used as flame-retardants. Tri-, tetra- and hexabromodiphenylether are preferred as additional bromination products of diphenylether in addition to pentabromodiphenylether.

TABLE A

| | | | | | | | |
|---|---|---|---|---|---|---|---|
| Mixtures having good stability and low tendency to precipitate. | | | | | | | |
| Bromine content % | Viscosity at 50° C. (cp) | Acetone solution stable for 24 hours? | Tri- | Tetra- | Penta- | Hexa- | Higher brominated products |
| | | | | bromodiphenylether | | | |
| 67.9 | 650 | yes | 1.5 | 53 | 42 | 3.5 | 0.2 |
| 69.0 | 1900 | yes | 0.2 | 43 | 50 | 6 | 0.7 |
| 69.0 | 3960 | yes | 0.1 | 35 | 55 | 9 | 0.8 |
| 69.2 | 3650 | yes | 0.2 | 30 | 55 | 10 | 1.0 |

The mixtures of the bromination products can be dissolved in the solvents at 60° C., acetone being preferred. High concentrations are achievable, amounting to as much as 70 and 80 wt.% solutions.

The solutions are stable for more than 24 hours and offer advantages in production owing to higher concentration and ease in maintaining a supply.

The finished laminates may contain 35 to 65 wt.% of a reinforcement and 65 to 35 wt.% of an impregnation composed of epoxy resin and PBD as flame retardant.

The laminates of the invention can be used advantageously for all known laminate applications. Advantages are achieved when they are used as electrical insulating materials and as support material for printed circuits using foils of, for example, copper pressed preferably with the aid of a heat-activated adhesive onto the laminate. The metal foil may additionally be given an electrical leakage resistant covering layer consisting, for example, of paper impregnated with a moisture-proof melamine resin or an aliphatic or cycloaliphatic epoxy resin.

Special advantages deriving from high flame resistance and good workability are also achieved in the use of decorative laminates and facing materials in automobile manufacture or interior decoration. In this case advantages over laminates, especially hard papers with flame-proofing agents of the prior art, are low moisture absorption, the avoidance of damage due to blistering, and low susceptibility to harm from condensation or protective water. Printed or colored sheet materials, films, webs, fabrics, wood veneers or other coverings may be pressed onto one or both sides and they may also be impregnated with the above-mentioned resins.

The manufacture of the laminates is generally performed by imbibing the glass fiber layers or other reinforcing materials with the impregnating solution. This may be done by applying the solution with a roller, for example, by spraying or by dipping. In continuous processes it is advantageous to pass the web of fabric through an impregnating bath in the one-step process or also in multi-step processes. This is followed in a known manner by drying and condensing the synthetic resin, using a drying tunnel advantageously for this purpose. The final setting of the thermosetting resin is performed in a known manner in a hot press with the application of a pressure of 30 to 150 kp/cm$^2$ and at temperatures ranging from 130° to 180° C., preferably at 160°–170° C., a plurality of superimposed layers of the impregnated and predried fabric being commonly pressed to form laminates at pressing times of 30 to 90 minutes.

In order to more fully illustrate the nature of the invention and the manner of practicing the same, the following examples are presented.

EXAMPLE 1

(a) A glass fabric of 1200 mm. width and a weight of 200 grams per square meter supplied in rolls was continuously unwound and passed through an impregnating bath of the composition described below containing 25% PBD by weight. The immersion time was 30 seconds. The fabric wet with the impregnating solution was carried over two idler rolls and freed of excess solution by squeezing between two steel rolls. From the rolls the band was carried on through a drying tunnel in which it was heated over a period of 4 minutes beginning at 150° C. and increasing to 170° C., with preliminary condensation of the resin. In a cutting apparatus rectangular pieces 1200 mm long and 1100 mm wide were cut from the band. Eight of these fabric sheets were laid together and heated in a heating press for 60 minutes at a pressure of 70 kp/m$^2$ and a temperature of 170° C. A hard paper board 1.6 mm. thick was thus produced. The amount of fabric in the laminate was 58% by weight.

(b) Using the procedure described in Example 1a and the impregnating bath of Table 1 a cellulose paper with a weight of 120 g/sq m was impregnated instead of the glass fabric.

TABLE 1

| Resin support | Weight parts | |
|---|---|---|
| | Example 1a | Example 1b |
| | Glass fabric | Cellulose paper |
| Solid resin glycidyl ether from bisphenol A, epoxy equivalent 475 gr/epoxy | 68.8 | 68.8 |
| Benzyldimethylamine | 0.2 | 0.2 |
| Dicyandiamide | 4 | 4 |
| Pentabromodiphenylether (techn.) | 25 | 25 |
| Antimony trioxide | 2 | 2 |
| Acetone | 80 | 80 |

EXAMPLE 2

For comparison, in another experiment in impregnating solution in accordance with Table 2 was used, which contained no PBD, but whose solid resin contained a glycidyl ether obtained from brominated bisphenol A, in which 25% of the solid resin was prepared from tetrabromobisphenol A (TBB) and 75% was prepared from bromine-free bisphenol A. In Example 2a the glass fabric of Example 1a was used, and in Example 2b the cellulose paper of Example 1b was used.

TABLE 2

| Resin support | Weight parts | |
|---|---|---|
| | Example 2a | Example 2b |
| | Glass fabric | Cellulose paper |
| Solid resin glycidyl ether from brominated bisphenol A | 93.8 | 93.8 |
| Benzyldimethylamine | 0.2 | 0.2 |
| Dicyandiamide | 4.0 | 4.0 |
| Antimony trioxide | 2.0 | 2.0 |
| Acetone | 80 | 80 |

As Table 4 shows, the laminates thus prepared are greatly inferior to those of Examples 1a and 1b.

EXAMPLES 3 AND 4

A laminate was prepared in accordance with Example 1a, but the PBD content of the impregnating bath was reduced as specified below to 20 and 15 wt.% PBD, respectively.

TABLE 3

| Resin support | Weight parts | |
|---|---|---|
| | Example 3 | Example 4 |
| | Glass fabric | Glass fabric |
| Solid resin glycidylether from Bisphenol A Epoxy equivalent 475 gr/epoxy | 73.8 | 78.8 |
| Benzyldimethylamine | 0.2 | 0.2 |
| Dicyandiamide | 4 | 4 |
| Pencabromodiphenylether (techn.) | 20 | 15 |
| Antimony trioxide | 2 | 2 |
| Acetone | 80 | 80 |

Even the laminate containing 20% PBD achieves flammability class SE 0, and the one containing 15% PBD class SE 1, corresponding to the lesser proportion of PBD. The temperature stability as well as the bond between layers is excellent and far superior to the laminate of Example 2a.

TABLE 4

| Example | | 1a | 3 | 4 | 1b | 2a | 2b |
|---|---|---|---|---|---|---|---|
| | | 25% PBD | 20% PBD | 15% PBD | 25% PBD | 25% TBB | 25% TBB |
| Resin support | | Glass fabric | Glass fabric | Glass fabric | Cellu. paper | Glass fabric | Cellu. paper |
| Temperature stability 260° C. oil bath, 10 min. | | Not discolored | Not discolored | Not discolored | — | carbonized | — |
| 200° C. circ. air, 3 days) | | Superficially discolored | Superficially discolored | Superficially discolored | — | carbonized | carbonized |
| 200° C. circ. air, 10 days) | | | | | | | |
| Flammability class UL492 | | SE 0 | SE 0 | SE 1 | SE 0 | SE 0 | SE 0 |
| 1. Afterburning UL492 seconds | | 1–2 | 1–5 | 4–15 | 1–5 | 1–3 | 1–4 |
| 2. Afterburning UL492 seconds | | 1–2 | 1–6 | 5–20 | 1–7 | 1–7 | 1–8 |
| Layer bond, ball pressure test* | | Score 1 | Score 1 | Score 1 | — | Score 2 | — |
| Strength of adhesion DIN-40802 | kg/25 mm | 5.9 | 5.8 | 5.8 | 4.3 | 5.4 | 4.2 |
| Bonding Strength DIN 7735 | kp/sqcm | 4950 | 4920 | 4900 | 1600 | 4800 | 1650 |
| Bonding Strength after 3 days 200° C. | kp/sqcm | 4000 | 4050 | 4000 | 1400 | 100 | <90 |
| Insulation resistance after a. | ohms | $10^{13}$ | $10^{13}$ | $10^{10}$ | $10^{12}$ | $10^{13}$ | $10^{12}$ |

*A ball of 10 mm diameter is pressed into the 1.5 mm thick laminate, to a depth of 3 mm, against a support bored with a hole 20 mm in diameter (Test Procedure of Siemens, Siemens Standard SHM 057032, Oct. 1969.

What is claimed is:

1. A fibrous structure consisting essentially of a cellulosic or glass fibrous substrate impregnated and imbibed with an epoxide resin and liquid pentabromodiphenyl ether, said pentabromodiphenyl ether being present in an amount of 5 to 30 percent by weight based upon the weight of said epoxide resin, said fibrous structure having a bending strength, determined after three days at 200° C. in accordance with Deutsche Industrie Norm 7735 of at least 1,000 kp/cm², said structure having a flamability rating according to Underwriters' Laboratory Test 492 of no greater than 1.

2. A fibrous structure according to claim 1 which consists of said fibrous substrate, said epoxy resin and said liquid pentabromodiphenyl ether.

3. A fibrous structure according to claim 1 wherein said pentabromodiphenyl ether is dissolved in a solvent.

4. A fibrous structure according to claim 1 wherein the fibers of said fibrous structure are glass fibers.

5. A fibrous structure according to claim 4 wherein said structure is in the form of a sheet and contains between 35 and 65 wt.% of said composition comprising epoxide resin and pentabromodiphenylether.

6. A fibrous substrate according to claim 5 wherein the pentabromodiphenylether is in admixture with at least one additional brominated diphenyl ether and the bromine content of the mixture is 66.0 to 70.5 wt.%.

7. A fibrous substrate according to claim 6 wherein the amount of pentabromodiphenylether is 35 to 70% by weight based upon the mixture of brominated products.

8. A fibrous structure according to claim 7 wherein the mixture of brominated diphenyl ether is within the following range:
Pentabromodiphenylether: 40–60 wt.%
Tetrabromodiphenylether: 15–45 wt.%
Hexabromodiphenylether: 1–20 wt.%
Tribromodiphenylether: 0–5 wt.%
Octabromodiphenylether: 0–2 wt.%.

9. A fibrous structure according to claim 4 having a flammability rating according to Underwriters' Laboratory Test 492 of SE 0.

10. A fibrous structure according to claim 9 having a score of 1 determined by the test procedure of Siemens, Siemens Standard SHM 057032 of October 1969.

11. A fibrous structure according to claim 5 laminated to a metallic surface.

12. A fibrous structure according to claim 11 wherein the metallic surface is copper.

13. A fibrous structure according to claim 11 composed of cellulose fibers.

14. A fibrous structure according to claim 13 wherein said structure is in the form of a sheet and contains between 35 and 65 wt.% of said composition comprising epoxide resin and pentabromodiphenylether.

15. A fibrous structure according to claim 14 wherein pentabromodiphenylether is in admixture with at least one additional brominated diphenyl ether and the bromine content of the admixture is 66.0 to 70.5 wt.%.

16. A fibrous structure according to claim 15 wherein the amount of pentabromodiphenylether is 35 to 70 wt.% based on the mixture of brominated products.

17. A fibrous structure according to claim 16 wherein the mixture of brominated diphenyl ether is within the following range:
Pentabromodiphenylether: 40–60 wt.%
Tetrabromodiphenylether: 15–45 wt.%
Hexabromodiphenylether: 1–20 wt.%
Tribromodiphenylether: 0–5 wt.%
Octabromodiphenylether: 0–2 wt.%.

18. A fibrous structure according to claim 14 having a flammability rating according to Underwriters' Laboratory Test 492, of SE 0.

19. A fibrous structure according to claim 18 having a score of 1, determined by the test procedure of Siemens, Siemens Standard SHM 057032 of October 1969.

20. A fibrous structure according to claim 14 laminated to a layer of a metallic substrate.

21. A fibrous structure according to claim 20 wherein the metallic substrate is copper.

22. A pressed laminate comprising a fibrous structure consisting essentially of a cellulosic or glass fibrous substrate impregnated and imbibed with an epoxide resin and liquid pentabromodiphenylether, said pentabromodiphenylether being present in an amount of 5 to 30 percent by weight based upon the weight of said epoxide resin, said fibrous structure having a bending strength, determined after three days at 200° C. in accordance with Deutsche Industrie Norm 7735 of at least 1,000 kp/cm$^2$, said structure having a flamability rating according to Underwriters' Laboratory Test 492 of no greater than 1, said fibrous structure being adhered to a sheet.

23. A pressed laminate according to claim 6 wherein said sheet is a metallic sheet.

* * * * *